United States Patent
Nguyen et al.

(10) Patent No.: US 6,311,959 B1
(45) Date of Patent: Nov. 6, 2001

(54) METHOD AND APPARATUS FOR GENERATING CONTROLLED MIXTURE OF ORGANIC VAPOR AND INERT GAS

(75) Inventors: Son T. Nguyen; Scott Hendrickson, both of San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/298,319

(22) Filed: Apr. 22, 1999

(51) Int. Cl.$^7$ .......................................................... B01F 3/04
(52) U.S. Cl. ..................................... 261/119.1; 261/121.1
(58) Field of Search .................................. 261/27, 28, 29, 261/72.2, 119.1, 121.1, 122.1, 126

(56) References Cited

U.S. PATENT DOCUMENTS

| | | | |
|---|---|---|---|
| 3,855,974 | * | 12/1974 | Mayer . |
| 4,235,829 | * | 11/1980 | Partus . |
| 4,436,674 | * | 3/1984 | McMenamin . |
| 4,582,480 | * | 4/1986 | Lynch . |
| 4,861,524 | * | 8/1989 | Sielaff . |
| 4,979,545 | * | 12/1990 | Fair . |
| 4,979,643 | * | 12/1990 | Lipisko . |
| 5,030,362 | * | 7/1991 | Da Silva . |
| 5,035,200 | * | 7/1991 | Moriyama . |
| 5,203,925 | * | 4/1993 | Shibuya . |
| 5,279,338 | * | 1/1994 | Goosens . |
| 5,381,742 | * | 1/1995 | Linton . |
| 5,431,733 | * | 7/1995 | Shubuya . |
| 5,440,887 | * | 8/1995 | Nishizato . |
| 5,520,969 | * | 5/1996 | Nishizato . |
| 5,531,183 | * | 7/1996 | Sivaramakrishnam . |
| 5,551,309 | * | 9/1996 | Goossens . |
| 5,589,110 | * | 12/1996 | Motoda . |
| 5,966,499 | * | 10/1999 | Hinkle . |
| 5,972,117 | * | 10/1999 | Schmitt . |
| 6,019,114 | * | 2/2000 | Rodgers . |
| 6,135,433 | * | 10/2000 | Nurmi . |
| 6,161,398 | * | 12/2000 | Partus . |

FOREIGN PATENT DOCUMENTS 0 723 214-A1 * 7/1996 (EP) .
0 506 012-A1 * 9/1996 (EP) .

OTHER PUBLICATIONS

Boer, H. J., "Liquid–Injection System Based on Mass Flow Controllers," Solid State Technology, Cowan Publishing Corp., Washington, DC, vol. 39 No. 3, Mar. 1, 1996, p. 149–152.*

Sherwood et al., Mass Transfer, McGraw–Hill, 1975, p.231–236.*

Perry's Handbook of Chemical Engineering, 5th ed., McGraw–Hill, 1973, p.22–19–22–21.*

Mills, A. F., Heat and Mass Transfer, Irwin Publishers, 1995, "Concentrations at Interfaces" (§ 9.2.2 at pp. 814–816) and "Mass Convection" (§ 9.4–9.4.2 at pp. 839–841).*

Product spec sheet for STEC LV series Liquid Mass Flow Controllers from http://global.horiba.com (publication date unknown) (downloaded Mar. 16, 2001).*

Application note: "Basics of Thermal Mass Flow Controllers" from www.unit.com (publication date unknown) (downloaded on or about Mar. 16, 2001).*

Bird, Stewart, & Lightfoot, "Transport Phenomena," John Wiley, 1960, p541–542.*

* cited by examiner

Primary Examiner—Chester T. Barry
(74) Attorney, Agent, or Firm—Ostroff & Associates

(57) ABSTRACT

Method and apparatus generate a mixture of the vapor of an organic liquid such as tetraethylorthosilicate (TEOS) and an inert gas such as helium. The ratio of organic vapor to inert gas in the mixture is accurately and continuously controlled as required in semiconductor manufacturing. The apparatus encloses a bubbler chamber which is filled with an organic liquid (e.g., TEOS) to a set level that is automatically maintained. The liquid is also maintained at an exact temperature (e.g., 75° C.). Inert gas (e.g., helium) flows into the bubbler chamber at a controlled rate and continuously evaporates some of the liquid therein. The flow of liquid into the bubbler chamber is monitored by a liquid control circuit, and flow of gas is controlled by a gas control circuit. A feedback signal from the liquid control circuit to the gas control circuit incrementally adjusts gas flow into the bubbler chamber to keep the liquid therein at the set level.

17 Claims, 2 Drawing Sheets

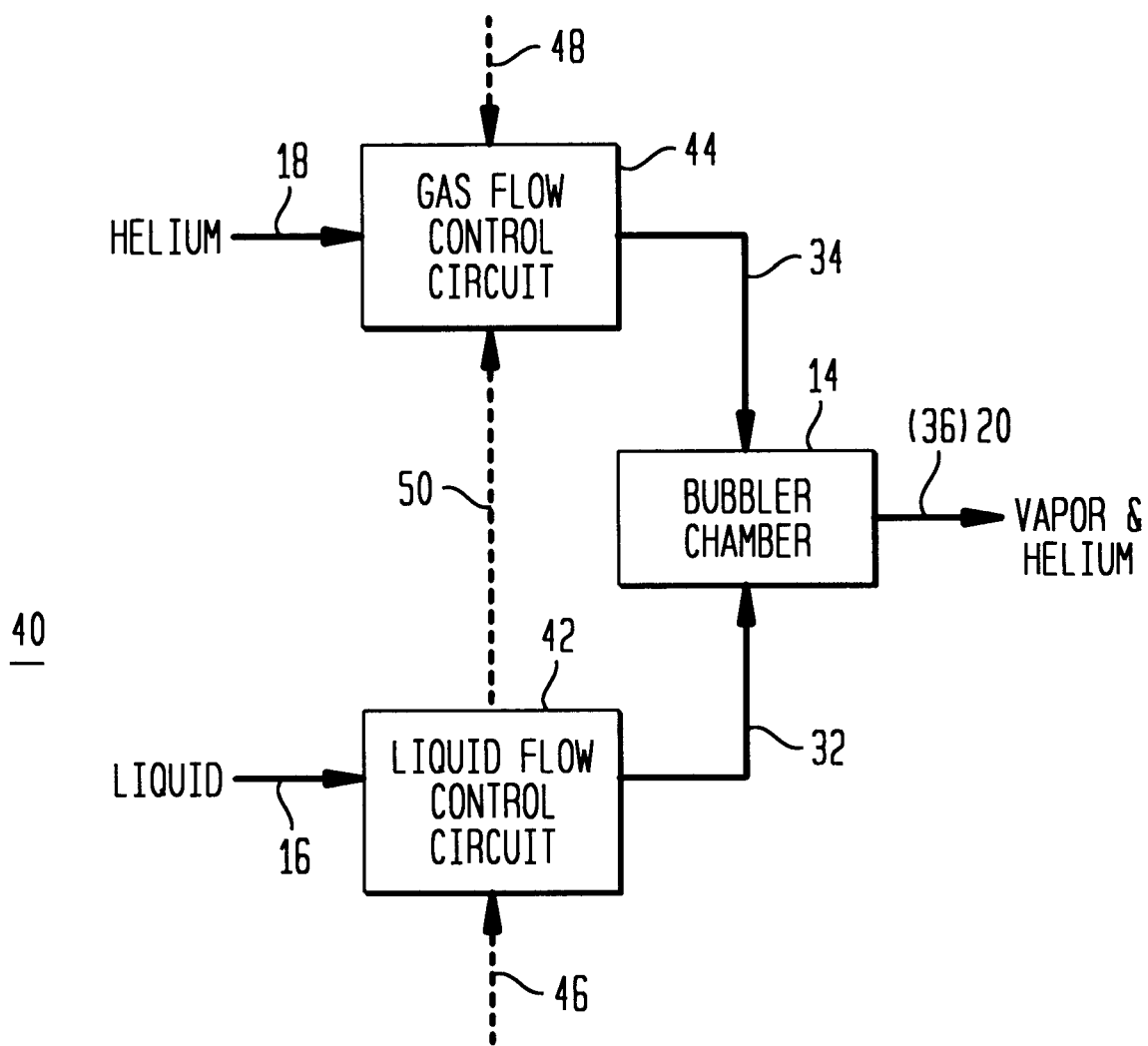

METHOD AND APPARATUS FOR GENERATING CONTROLLED MIXTURE OF ORGANIC VAPOR AND INERT GAS

FIELD OF THE INVENTION

This invention relates to improved method and apparatus for generating a mixture of an organic vapor, such as the vapor of tetraethylorthosilicate (TEOS), and an inert gas such as helium, the mixture having a precisely controlled ratio of vapor-to-gas such as required during semiconductor manufacturing for the deposition of highly uniform layers of insulation (e.g., $SiO_2$).

BACKGROUND OF THE INVENTION

In the manufacturing of semiconductor devices, such as integrated circuits, memories, etc., a semiconductive wafer (e.g., a thin disc of single-crystal silicon) is sequentially put through a number of processing steps (well known in the art). One or more of these steps involve exposing the wafer to a mixture of reactive gasses to deposit thin layers of insulation, such as silicon dioxide ($SiO_2$), on exposed surfaces of the wafer. The reactive gasses comprise, for example, ozone on the one hand and an organic vapor of a liquid, such as tetraethylorthosilicate (TEOS), in an inert gas such as helium on the other hand. Because ozone and organic vapor such as TEOS immediately begin reacting when mixed together, they are brought separately into close proximity of a wafer on which insulation is to be deposited, and then mixed together. The mixed gases are then flowed immediately as a uniform cloud or dispersion of reactive gas upon and over the wafer thereby depositing a layer of insulation thereon.

It is desirable, for uniform and rapid deposition of an insulating layer on the wafer during a given time interval, that a mixture of TEOS vapor and helium, for example, have a sufficient, and precisely controlled amount of TEOS vapor per standard units of measurement. This in turn requires that the TEOS vapor-helium mixture be generated at a slightly elevated temperature (e.g., somewhat above about 65° C.) so that none of the TEOS vapor in the mixture condenses as liquid and thereby decreases the desired ratio of vapor to helium.

A typical prior art module which generates an organic vapor-inert gas mixture (e.g., TEOS vapor and helium) is somewhat bulky and operates at an elevated temperature. Because of limited space and to minimize thermal buildup it is customary to place such a module a convenient distance (e.g., a few feet) away from where a wafer-processing chamber is located. The gas mixture from the module is then piped to the wafer chamber via a suitable means.

In the past, different ways of generating organic vapor-inert gas mixtures for semiconductor manufacturing have been employed. A first way was to bubble the inert gas through a container of organic liquid (e.g., TEOS). The ratio of vapor to gas in the resulting output mixture was controlled by measuring the amount of organic vapor in the output mixture of vapor and gas. But such vapor measurements are not as accurate as is desirable and the equipment used to generate the vapor-gas mixture was relatively bulky, in part because the quantity of liquid in the container was not controlled to a set amount. Therefore an extra amount of liquid, requiring a larger container, was used to provide for variations in the liquid level during operation.

A second widely used way of generating an organic vapor-inert gas mixture is to inject, by means of an injector head, a fine mist of organic liquid into a stream of inert gas at an elevated temperature (e.g., 120°). This system works reasonably well but has several disadvantages. The injector head is prone to clogging and this sometimes requires temporary shutdown and servicing of the equipment. Moreover, the organic vapor causes wear within the injector head with the result that it must be frequently replaced (e.g., every six months or so). It is desirable therefore to have a way of generating a mixture of organic vapor and inert gas which provides highly precise and continuous control of the amount of vapor in the mixture and which avoids the problems and costs of previous equipment.

SUMMARY OF THE INVENTION

In accordance with one aspect of the invention there is provided a highly effective method of generating an organic vapor-inert gas mixture (e.g., TEOS vapor-helium) with precise and continuous control of the ratio of vapor to gas in the mixture. This in turn, during a given time interval in a semiconductor processing step, insures the deposition of a uniform layer of insulation having a predetermined thickness. Variation in the ratio of vapor to gas in the mixture would otherwise result in different thickness of insulation being deposited during the given time interval, which of course is undesirable.

The method provided by the invention includes filling a relatively small chamber (colloquially termed a "bubbler") with an organic liquid, such as TEOS, the chamber being filled to a predetermined or set level and thereafter kept at that level. The liquid is maintained at a desired temperature (e.g., 75° C.)somewhat above ambient. An inert gas such as helium, is bubbled through the liquid in the chamber at a controlled rate, and a resulting vapor-gas mixture is continuously exhausted from the chamber. The level or quantity of liquid in the chamber is automatically maintained at the set value by controlled flow of gas into the chamber and by continuous monitoring of the liquid flow rate.

The respective flows of inert gas and of organic liquid into the bubbler chamber are controlled by electronic circuits utilizing digital signals from computer inputs and signals from respective gas flow and liquid flow, all of which are highly accurate. These control circuits and respective signals are connected in a feedback arrangement which insures that the ratio of organic vapor to inert gas in the mixture flowing out of the bubbler chamber is constantly held within very tight limits. This in turn means that the amount of organic vapor delivered by the mixture of vapor and gas per unit time to a semiconductor manufacturing station is controlled with great accuracy.

In accordance with another aspect of the invention there is provided a method of accurately controlling the ratio of liquid vapor to gas in a mixture of the two. The method includes the steps of: flowing liquid into a chamber; flowing gas into the chamber and bubbling it through the liquid; determining whether liquid in the chamber is being evaporated at a rate at variance with that desired; generating a feedback signal in accordance with the variance in the rate of evaporation of the liquid; modifying the flow rate of gas into the chamber in accordance with the feedback signal to maintain the evaporation of the liquid at the desired rate; and evacuating from the chamber a mixture of vapor and gas such that the amount of vapor in the mixture is controlled.

In accordance with still another aspect of the invention there is provided an apparatus for generating a liquid vapor and gas mixture with accurate control of the vapor to gas ratio. The apparatus comprises a housing defining a chamber for containing a liquid to be vaporized, a liquid supply for flowing liquid into the chamber at a predetermined rate, a gas supply for flowing gas into the chamber to evaporate liquid therein, an exhaust for exhausting a mixture of vapor and gas from the chamber, and a control circuit. The control circuit controls the gas supply and generates a feedback signal from the flow of liquid into the chamber in accordance with whether the flow of liquid therein is increasing or decreasing, relative to the predetermined rate, the feedback signal incrementally adjusts the flow of gas into the chamber such that the mixture of vapor and gas exhausted from the chamber has a predetermined ratio of vapor to gas. This in turn means that the amount of organic vapor delivered by the mixture of vapor and gas per unit time to a semiconductor manufacturing station is controlled with great accuracy.

A better understanding of the invention will best be gained from the following detailed description and claims taken in conjunction with the accompanying drawings.

BRIEF DESCRIPTION OF THE DRAWINGS

FIG. 2 is a block diagram schematically showing the apparatus of FIG. 1 including its control circuitry, and illustrating how it is operated to produce a vapor-gas mixture with the ratio of vapor to gas being automatically held within tight limits.

DETAILED DESCRIPTION

Figure 1:
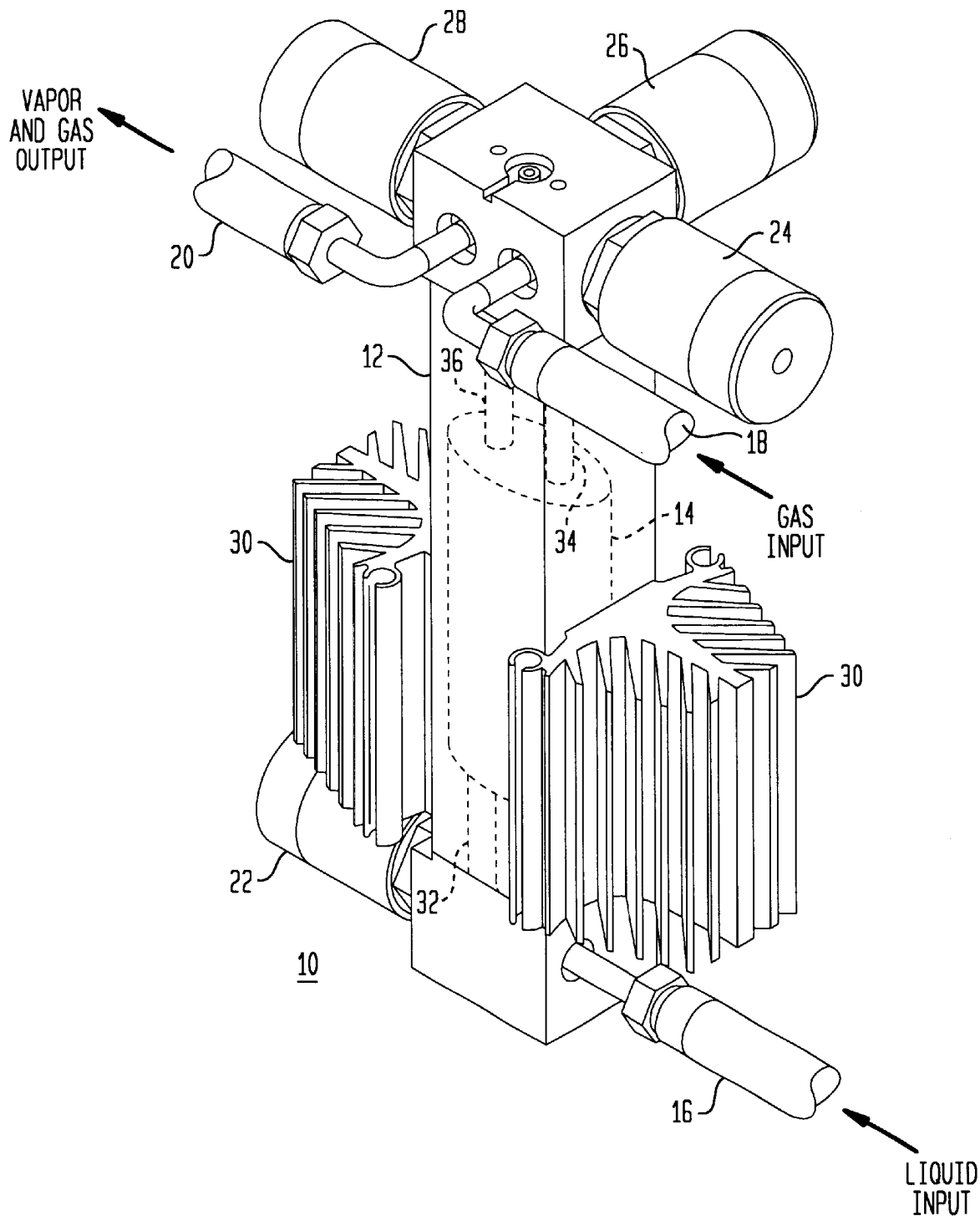
FIG. 1 is a perspective view, with some portions not shown, of apparatus provided according to the invention for generating a precisely controlled mixture of organic vapor and inert gas such as used in semiconductor processing.

Referring now to FIG. 1, there is shown an apparatus 10 embodying features of the invention for generating an organic vapor-inert gas mixture having a closely controlled ratio of organic vapor to inert gas, such as is particularly useful in semiconductor manufacturing. The apparatus 10, portions of which are not shown here, comprises a housing 12, a bubbler chamber 14 (shown in dashed outline), a liquid input pipe 16, an inert gas input pipe 18, a vapor and gas output pipe 20, an input liquid control solenoid valve 22, an input gas control solenoid valve 24, a gas bypass solenoid valve 26, an output vapor-gas mixture control solenoid valve 28, and heat exchanger fins 30. Electronic control circuits, liquid level sensor, and gas and liquid flow monitors which are part of the apparatus 10 and important to its operation are not shown in FIG. 1. They will be described in complete detail shortly in connection with FIG. 2.

Still referring to FIG. 1, the housing 12 is thermally insulated. Its interior and the bubbler chamber 14 are accurately maintained at a desired temperature (e.g., 75° C.) by a solid-state thermal unit (not shown) which operates on the Pellitier principle. The outside of the thermal unit is connected to the heat exchanger fins 30 which exchange thermal energy from the atmosphere and help the thermal unit accurately maintain the interior temperature of the housing at a desired value somewhat above ambient (e.g., 75° C.).

The bubbler chamber 14 is filled to a predetermined or set level with an organic liquid such as TEOS. During operation of the apparatus 10, the quantity of liquid in the chamber 14 is automatically maintained at this set level by an automatic liquid level control mechanism (not shown) associated with the bubbler chamber 14. This automatic mechanism acts to incrementally increase or decrease the flow of liquid into the chamber 14 as required to maintain the liquid at the set level, and is well known in the art. Liquid from the pipe 16 is fed through the solenoid valve 22 into the chamber 14 via an internal pipe 32 (shown in dashed outline). This automatic operation will be described in greater detail hereinafter.

Inert gas, such as helium, is fed into the apparatus 10 via the pipe 18, the solenoid valve 24 and an internal pipe 34 (shown in dashed outline), an end of which extends down into the bubbler chamber 14. When gas is bubbling through the end of the pipe 34 into and through the liquid in the bubbler chamber 14, the flowing gas causes continuous evaporation of some of the liquid. An internal pipe 36 (shown in dashed outline) at the top of the chamber 14 exhausts, via the output solenoid valve 28 to the output pipe 20, a mixture of vapor and gas being generated within the chamber 14 by the bubbling action of the gas. The flow of gas into the chamber 14 via the pipe 18 is automatically controlled by the solenoid valve 24, and this in turn controls a mixture of vapor and gas in a predetermined ratio flowing out of the chamber 14 to the output pipe 20, as will be further explained shortly. The solenoid valve 26 serves to bypass the inert gas from the input pipe 18 directly to the output pipe 20, without the inert gas flowing through the bubbler chamber 14, whenever it is desired to purge the output pipe 20 of the apparatus 10 of the vapor and gas mixture. A unit comprising the housing 12, bubbler chamber 14, and associated elements such as shown in FIG. 1 is commercially available, for example from the vendor Icon Dynamics, LLC, New York.

Referring now to FIG. 2, there is shown a schematic block diagram 40 illustrating portions of the apparatus 10. The diagram 40 shows the bubbler chamber 14, the input liquid pipe 16 (represented as a solid line), the input gas pipe 18 (represented as a solid line), a liquid flow control circuit 42 (shown in block form), a gas flow control circuit 44 (shown in block form), the internal liquid pipe 32 (represented as a solid line), the internal gas pipe 34 represented as a solid line), the output pipe (36) 20 (represented as a solid line), a first electrical signal path 46 (shown as a dashed line), a second electrical signal path 48 (shown as a dashed line), and an electrical feedback signal path 50 (shown as a dashed line) between the circuits 42 and 44.

For the sake of the following explanation, it is to be assumed that the input liquid solenoid valve 22 (not shown here but see FIG. 1) is part of the liquid flow control circuit 42, along with an input liquid flow meter (not shown) in the pipe 16, and associated electronic memory, logic, and control elements (not shown). Similarly, it is to be assumed that the input gas solenoid valve 24 (not shown here but see FIG. 1) is part of the gas flow control circuit 44 along with an input gas flow meter (not shown) in the pipe 18, and associated electronic memory, logic, and control circuits (not shown). The liquid flow control circuit 42, including a liquid flow meter (not shown) and the liquid solenoid valve 22, is commercially available, for example from the vendor Stec, Inc. Similarly, the gas flow control circuit 44, including a gas flow meter (not shown) and the gas solenoid valve 24, is commercially available, for example from the vendor Tylan General.

To begin gas bubbling operation of the apparatus 10, electronic signals from a computer (not shown) are applied to the respective signal paths 46 and 48, and a signal is applied (via a path not shown) to the output solenoid valve 28 to open it. The computer signal applied to the liquid flow control circuit 42 via the signal path 46 opens the input liquid solenoid valve 22, and provides a bench-mark value for liquid flow via the pipes 16 and 32 into the bubbler chamber 14. The computer signal applied to the gas flow control circuit 44 via the signal path 48, together with a feedback signal via the signal path 50 determine the setting of the input gas solenoid valve 24 and hence the flow of inert gas via the pipes 18 and 34 into the bubbler chamber 14.

During gas bubbling operation of the apparatus 10 liquid flow into the chamber 14 is monitored by the liquid control circuit 42 by comparing a signal from the liquid flow meter (not shown) in the pipe 16 with the signal received via the path 46 from the computer. Logic circuitry (not shown) within the liquid control circuit 42 then determines whether liquid flow into the bubbler chamber 14 is above or below a predetermined value desired for it because it is being evaporated at a rate less or greater than that specified by the input computer signal applied to the signal path 46. In the event that the rate of evaporation differs from that desired, and in order to keep the liquid in the bubbler chamber 14 at precisely the set level for a given liquid flow into the chamber, the liquid control circuit 42 applies a feedback signal via the signal path 50 to the gas control circuit 44. This feedback signal via the lead 50 and the input computer signal via the signal path 48 together cause logic circuitry (not shown) in the gas control circuit 44 to make fine, incremental adjustments in the setting of the input gas solenoid valve 24. Thus, slightly less or slightly greater flow of gas into the bubbler chamber 14 will keep the liquid therein at precisely the set level for a desired liquid flow rate. In this way, the ratio of organic vapor to gas in the mixture of vapor and gas flowing out of the bubbler chamber 14 into the pipe (36) 20 is very accurately controlled to the precise value desired.

When the apparatus 10 is to be stopped in its gas bubbling operation, signals from the computer are applied via the respective control circuits 42 and 48 to each of the solenoid valves 22, 24 and 28 to close them. In the event the output pipe 20 is to be purged of the vapor-gas mixture, the solenoid valve 26 is opened (by a signal from the computer) from its normally closed condition to bypass the solenoid valves 24 and 28. This permits unmixed gas (e.g., helium) to flow directly from the input gas pipe 18 to the output pipe 20 without flowing through the bubbler chamber 14.

By way of example, in a specific embodiment of the apparatus 10 which has been built and tested, the bubbler chamber 14 had a volume of 150 milliliters, and was filled to a set level with TEOS liquid which was maintained at the set level and at a temperature of exactly 75° C. During operation, helium was flowed into the bubbler chamber 14 at 200 Torr pressure and at a rate of 20 standard liters per minute. Six grams of liquid TEOS per minute were flowed into the bubbler chamber 14 to maintain the liquid therein at the set level. The liquid flow meter and the gas flow meter employed in the apparatus 10 each had very high accuracy, as did the liquid level control mechanism. At the temperature of 75° C. vapor evaporated from the liquid in the chamber 14 remains as vapor in the resulting mixture of vapor and gas. Thus the ratio of vapor to gas in the vapor-gas mixture flowing into the output pipe 20 was automatically and accurately controlled by the control circuits 42 and 44 of the apparatus 10 to the precise ratio desired.

Because the apparatus 10 is so compact in size and has such low power consumption, it is easily possible to arrange a plurality of such units as a modular group in order to provide immediately on command a separate, different mixture of organic vapor and inert gas. Thus for example, one apparatus 10 may be supplied with TEOS liquid (as described above), a second apparatus 10 supplied with triethyborate liquid (TEB), and a third apparatus 10 supplied with triethylphosphate liquid (TEPO). The use of such organic materials is well known in the art of semiconductor manufacturing. Inert gasses other than helium may be used where desirable.

The above description is intended in illustration and not in limitation of the invention. Various modifications or changes in the embodiment of the invention which is described herein may occur to those skilled the art and can be made without departing from the spirit and scope of the invention as set forth in the accompanying claims. In particular, the apparatus 10 is not limited to use with TEOS liquid and helium, nor to a particular size of bubbler chamber 14, or to particular flow rates of gas and liquid, or to a given operating temperature. Details of construction and operation of the control circuits 42 and 44 are easily understood by those skilled in the art.

What is claimed is:

1. Apparatus for generating a vapor and gas mixture with precise and continuous control of the vapor to gas ratio, the apparatus comprising:
    a housing defining a chamber for containing a liquid to be vaporized;
    a liquid supply line for flowing liquid into the chamber;
    a gas supply line for flowing gas into the chamber to bubble through the liquid in the chamber and to evaporate the liquid therein;
    an exhaust line for exhausting the mixture of vapor and gas from the chamber; and
    a control circuit for controlling the liquid flow rate and for precisely and continuously controlling the ratio of vapor to gas in the exhausted mixture, the control circuit generating a feedback signal by measuring the flow of liquid into the chamber and determining whether the measured liquid flow rate is faster or slower than a desired amount, the feedback signal adjusting the flow of gas into the chamber, said control circuit adjusting the flow of liquid to maintain a precisely controlled liquid level in the chamber.

2. Apparatus for generating a vapor and gas mixture with precise and continuous control of the vapor to gas ratio, the apparatus comprising:
    a housing defining a chamber for containing a liquid to be vaporized;
    liquid supply means for flowing liquid into the chamber;
    liquid flow control valve means for controlling the liquid level in the chamber at a set level;
    gas supply means for flowing gas into the chamber to evaporate liquid therein;
    means for exhausting mixture of vapor and gas from the chamber; and
    control means for controlling the liquid flow rate, the control means generating a feedback signal by measuring the flow of liquid into the chamber and determining whether the rate of flow is faster or slower than a desired amount, the feedback signal adjusting the flow of gas into the chamber to maintain the liquid flow rate at the desired rate.

3. The apparatus of claim 2 wherein the control means comprises a liquid flow control circuit, and a gas flow control circuit and gas solenoid valve.

4. The apparatus of claim 2 wherein the housing is insulated and further comprises temperature control means for maintaining the liquid in the chamber at a precise temperature above ambient.

5. Apparatus for generating a mixture of the vapor of an organic liquid and an inert gas, with the ratio of vapor to gas being precisely and continuously controlled as required in semiconductor manufacturing, the apparatus comprising:
    a housing enclosing and thermally insulating a bubbler chamber;
    liquid supply means for flowing liquid into the chamber;
    gas supply means for flowing gas into the chamber to bubble through and evaporate liquid therein;

temperature control means for accurately maintaining the bubbler chamber and liquid therein at a desired temperature;

a liquid control circuit including a liquid flow meter for monitoring the flow of liquid into the chamber;

a gas control circuit for controlling the gas supply means and the flow of gas into the chamber;

output means for exhausting from the chamber a resulting mixture of vapor and gas; and feedback means from the liquid control circuit to the gas control circuit for maintaining the flow of gas into the chamber at a rate which maintains the liquid flow rate into the chamber at a desired rate such that the ratio of vapor to gas in the resulting mixture exhausted from the chamber is controlled.

6. The apparatus of claim 5 wherein the liquid supply means includes a liquid solenoid valve, and the gas supply means includes a gas solenoid valve, the valves being controlled by the respective control circuits.

7. The apparatus of claim 6 wherein the feedback means includes a signal path for sending a signal to the gas control circuit from the liquid control circuit representing deviation in the flow of the liquid into the chamber from a desired liquid flow rate.

8. The apparatus of claim 6 wherein the gas supply means further includes a gas flow meter, signals from the gas flow meter being coupled to the gas control circuit.

9. The apparatus of claim 5 further comprising a plurality of additional apparatuses each being essentially the same as the apparatus and with at least some of them supplied with a different organic liquid, such that immediately on command a different organic vapor and inert gas mixture can be supplied as required for a given processing step in semiconductor manufacturing.

10. Apparatus for generating a mixture of the vapor of an organic liquid and an inert gas, with the ratio of vapor to gas being precisely and continuously controlled as required in semiconductor manufacturing, the apparatus comprising:

a housing defining and thermally insulating a bubbler chamber;

liquid supply means for flowing liquid into the chamber to a set level therein, the liquid supply means including a liquid flow meter and a liquid solenoid valve;

gas supply means for flowing gas into the chamber to bubble through and evaporate liquid therein, the gas supply means including a gas flow meter and a gas solenoid valve;

temperature control means for maintaining the bubbler chamber and liquid therein at a desired temperature;

a liquid control circuit including electronic elements for monitoring the flow of liquid into the chamber and comparing that rate against a predetermined rate, the liquid control circuit being coupled to the liquid flow meter;

a gas control circuit including electronic elements for controlling the gas supply means and the flow of gas into the chamber, the gas control circuit being coupled to the gas flow meter and to the gas solenoid valve;

output means for exhausting from the chamber a resulting mixture of vapor and gas;

a liquid level mechanism for maintaining liquid in the bubbler chamber at the set level;

computer input means for applying an input signal to the liquid control circuit to designate a desired rate of flow of liquid into the bubbler chamber, and for applying an input signal to the gas control circuit to establish a rate of flow of gas into the bubbler chamber; and feedback signal means coupled between the liquid control circuit and the gas control circuit for controlling the flow of gas into the bubbler chamber so that the level of liquid in the bubbler chamber remains essentially constant at the set level such that the ratio of vapor to gas in the mixture exhausted from the bubbler chamber is controlled.

11. The apparatus of claim 10 wherein the temperature is 75° C., the liquid is tetraethylorthosilicate (TEOS), and the gas is helium, the flow of liquid being six grams per minute, and the flow of gas being 20 standard liters per minute at a pressure of 200 Torr.

12. The apparatus of claim 10 wherein the output means includes an output solenoid valve, and further comprises a solenoid valve for bypassing input gas flow directly to the output means instead of into the bubbler chamber, such that the output means can be purged of vapor-gas mixture.

13. A method of generating a mixture of the vapor of an organic liquid and an inert gas with the ratio of vapor to gas in the mixture being precisely and continuously controlled to a uniform value as required in semiconductor manufacturing, the method comprising the steps of:

flowing an organic liquid into a chamber and maintaining the level of liquid in the chamber at a set level;

flowing an inert gas into the chamber and bubbling the gas through the liquid to evaporate a portion thereof;

exhausting a resulting mixture of organic vapor and inert gas from the chamber;

determining whether the flow of liquid into the chamber deviates from a desired value and generating from any deviation a corresponding feedback signal; and controlling in accordance with a predetermined signal together with the feedback signal the rate of flow of inert gas into the chamber such that the ratio of vapor to gas in the mixture being exhausted from the chamber is controlled.

14. A method of precisely and continuously controlling the ratio of vapor to gas in a mixture of the two comprising the steps of:

flowing liquid into a chamber at a desired rate;

monitoring the liquid level and adjusting the liquid flow to maintain the liquid level at a precisely controlled level in the chamber;

flowing gas into the chamber and bubbling it through the liquid;

determining whether liquid flow into the chamber is at a rate at variance with that desired;

generating a feedback signal in accordance with the variance;

modifying the flow rate of gas into the chamber in accordance with the feedback signal to maintain the liquid flow at the desired rate; and evacuating from the chamber a mixture of vapor and gas such that the amount of vapor in the mixture is controlled.

15. The method of claim 14 wherein the liquid is tetraethylorthosilicate (TEOS) and the gas is helium, and the liquid is maintained at a fixed temperature above ambient.

16. The method of claim 15 wherein the flow of gas and hence the flow of liquid are controlled at desired rates.

17. The method of claim 16 wherein the rate of gas flow is 20 standard liters per minute at a pressure of about 200 Torr and the flow of liquid is six grams per minute, the liquid being maintained at 75° C.

* * * * *